United States Patent
Zimek et al.

(10) Patent No.: US 11,573,274 B2
(45) Date of Patent: Feb. 7, 2023

(54) DEVICE AND METHOD FOR DETECTING OSCILLATIONS OF A REGULATED SUPPLY SIGNAL

(71) Applicant: Infineon Technologies AG, Neubiberg (DE)

(72) Inventors: Bernd Zimek, Graz (AT); Hermann Hofer, Raaba-Grambrach (AT); Andreas Jaeger, Graz (AT)

(73) Assignee: Infineon Technologies AG, Neubiberg (DE)

( * ) Notice: Subject to any disclaimer, the term of this patent is extended or adjusted under 35 U.S.C. 154(b) by 18 days.

(21) Appl. No.: 17/344,091

(22) Filed: Jun. 10, 2021

(65) Prior Publication Data

US 2021/0405125 A1    Dec. 30, 2021

(30) Foreign Application Priority Data

Jun. 25, 2020 (DE) .................. 102020116723.7

(51) Int. Cl.
| | |
|---|---|
| *G01R 31/40* | (2020.01) |
| *G01S 7/497* | (2006.01) |
| *G01S 7/40* | (2006.01) |
| *G05F 1/56* | (2006.01) |

(52) U.S. Cl.
CPC ............ *G01R 31/40* (2013.01); *G01S 7/4008* (2013.01); *G01S 7/497* (2013.01); *G05F 1/56* (2013.01)

(58) Field of Classification Search
CPC .. G01R 31/40; G01R 19/16552; G01R 19/04; G01R 19/1659; G01R 19/00; G01R 19/30; G01R 19/165; G01S 7/4008; G01S 7/497; G01S 7/4004; G01S 7/285; G01S 13/931; G01S 7/352; G05F 1/56
USPC ........ 324/764.01, 103 R, 103 P, 500, 76.11; 327/56, 58, 62, 74, 97; 73/1.01
See application file for complete search history.

(56) References Cited

U.S. PATENT DOCUMENTS

| | | | |
|---|---|---|---|
| 3,590,811 A | * | 7/1971 | Harris ...................... A61B 5/30 600/521 |
| 3,769,596 A | | 10/1973 | Peersch |
| 9,797,992 B2 | | 10/2017 | Yukumatsu |
| 2006/0284655 A1 | | 12/2006 | Li et al. |
| 2007/0085526 A1 | | 4/2007 | Baker |
| 2017/0153296 A1 | | 6/2017 | Engl et al. |
| 2019/0058450 A1 | * | 2/2019 | Jun .......................... G01R 1/40 |
| 2019/0326956 A1 | * | 10/2019 | Balasubramanian .... H03K 5/24 |

FOREIGN PATENT DOCUMENTS

EP      3499478 A2    6/2019

\* cited by examiner

*Primary Examiner* — Tung X Nguyen
*Assistant Examiner* — Robert P Alejnikov, Jr.
(74) *Attorney, Agent, or Firm* — Harrity & Harrity, LLP

(57) ABSTRACT

The present disclosure relates to a detection circuit for detecting oscillations of a regulated supply signal. The detection circuit includes a filter circuit to filter the regulated supply signal in order to obtain a filtered supply signal. A peak value detector circuit is designed to detect an extremum of the filtered supply signal. A comparator circuit is designed to compare the detected extreme value with a threshold value and to indicate an understepping or exceedance of the threshold value.

15 Claims, 7 Drawing Sheets

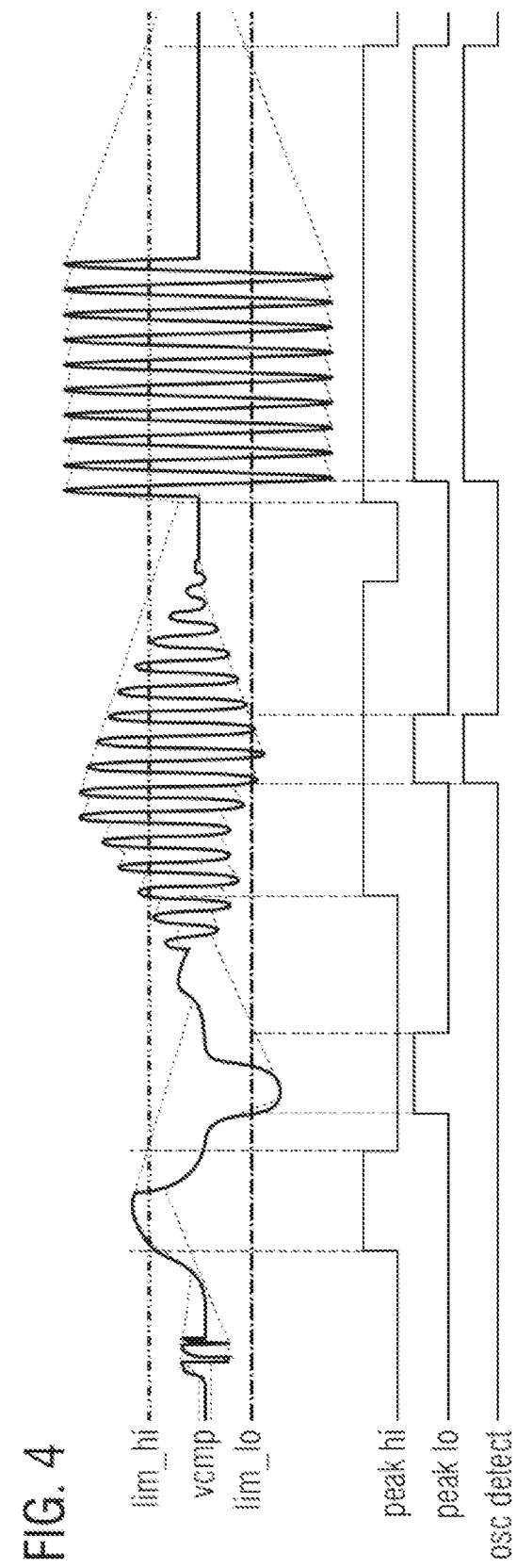

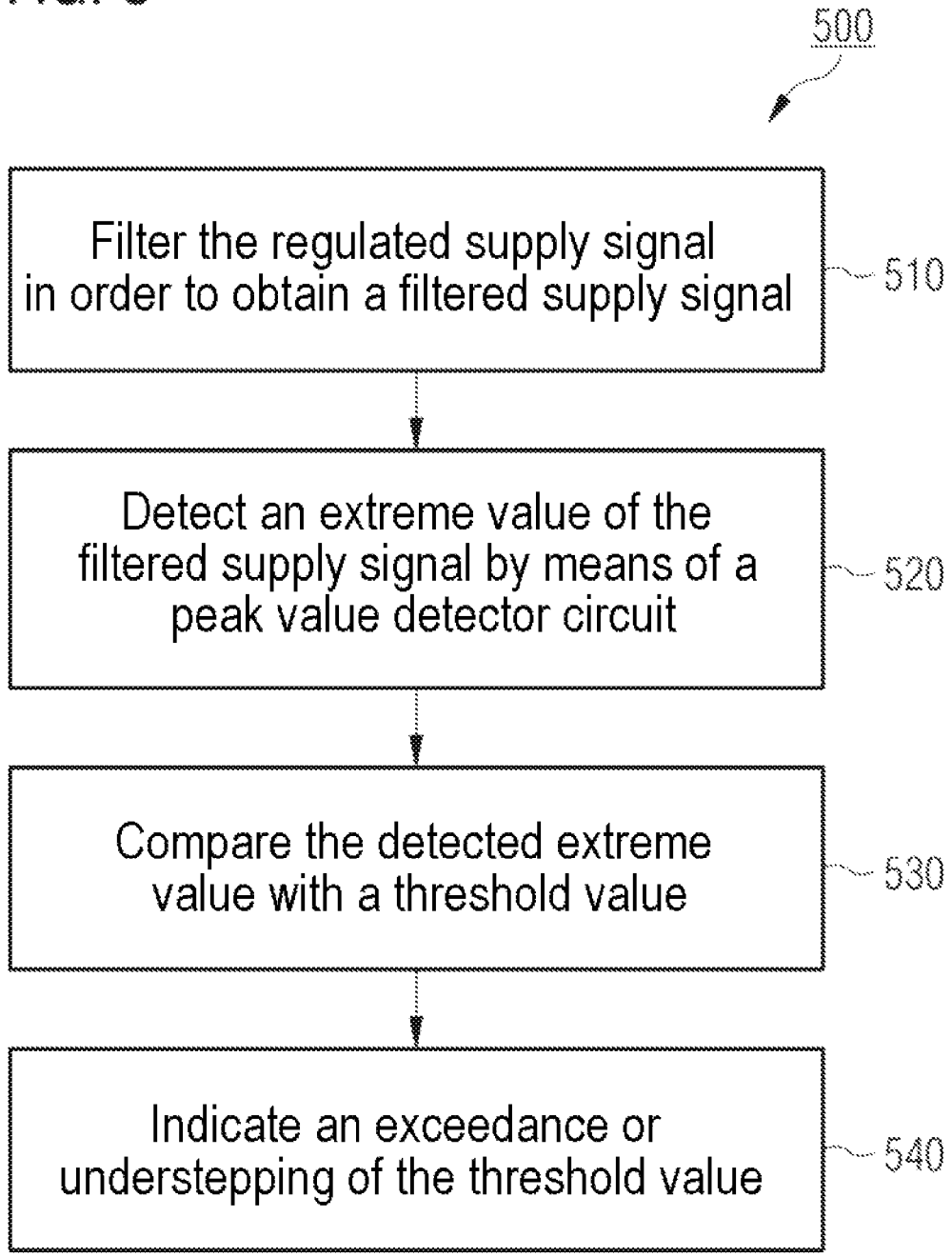

DEVICE AND METHOD FOR DETECTING OSCILLATIONS OF A REGULATED SUPPLY SIGNAL

RELATED APPLICATION

This application claims priority to German Patent App. No. 102020116723.7, filed on Jun. 25, 2020, which is incorporated herein by reference in its entirety.

FIELD

The present disclosure relates to devices and methods for detecting oscillations of a regulated supply signal, such as, for example, for detecting oscillations of a regulated supply voltage.

BACKGROUND

In voltage regulators designed as an integrated circuit, stability of a control loop can be guaranteed, for example, by means of a compensation capacitor which is connected externally to the integrated circuit (IC). Instability of the regulator can occur, for example, due to a broken bonding wire or a missing/deactivated external compensation capacitor. The instability of the regulator can result in unwanted oscillations of a regulated supply signal, such as, for example, a regulated DC voltage.

Such oscillations of regulated DC supply signals (DC=direct current) can be detected, for example, by means of voltage detectors with comparators on supply lines. However, this is not readily effective in detecting oscillations at high frequencies (e.g. >10 MHz). Very fast comparators would be required for this purpose. The oscillation detection circuit described in U.S. Pat. No. 3,769,596A operates only in a predetermined frequency band.

A need therefore exists for improved concepts for detection circuits for detecting oscillations of a regulated supply voltage, particularly in terms of a detection bandwidth.

SUMMARY

This need is taken into account by devices and methods according to the independent claims Advantageous developments form the subject-matter of the dependent claims.

According to a first aspect of the present disclosure, a detection circuit is proposed for detecting oscillations of a regulated supply signal. The detection circuit includes a filter circuit to filter the controlled supply signal in order to obtain a filtered supply signal. The detection circuit further includes a peak value detector circuit which is designed to detect an extreme value of the filtered supply signal. The detection circuit further includes a comparator circuit which is designed to compare the detected extreme value with a threshold value and to indicate an understepping or exceedance of the threshold value.

Oscillations having a high frequency and/or bandwidth can be detected through the use of peak value detectors. According to example embodiments, no fast comparators are required. A maximum oscillation frequency can be defined by a bandwidth of a peak value detector. According to some example embodiments, a bandwidth of a peak value detector of the peak value detector circuit is greater than twice an upper limit frequency for detecting the amplitude fluctuation. A peak value detector generally designates a circuit for measuring a maximum value of a time-variable signal which, in the simplest design, consists of a diode and a storage capacitor. The forward voltage of the diode can be reduced with an operational amplifier in which the diode is incorporated into the negative feedback branch. In addition, a high input resistance is produced by the operational amplifier. A parallel resistance to the capacitor allows peak values to be registered continuously. A relaxation time and therefore the bandwidth of the peak value detector (which defines the minimum oscillation frequency) can be adjusted by means of a discharge time constant of the peak value detector.

According to some example embodiments, the regulated supply signal is a regulated DC supply signal (DC=direct current), such as, for example, a regulated DC voltage or a regulated DC current.

According to some example embodiments, the filter circuit includes a high-pass or bandpass filter circuit. DC components of the regulated supply signal can thus be filtered out and instead only higher-frequency (unwanted) oscillations of the regulated supply signal can be allowed to pass through. A lower limit frequency of the filter circuit can depend, for example, on the expected oscillations of the regulated supply signal.

According to some example embodiments, the detection circuit further includes a reference signal source for setting at least one threshold value signal according to the threshold value for the comparator circuit. The reference signal source can include, for example, a bandgap reference circuit. A bandgap reference is a reference voltage source whose output voltage (in a temperature-compensated state) corresponds to the bandgap voltage of a semiconductor. The generated voltage thus varies according to the semiconductor material. One particular characteristic of a bandgap reference is high precision without complex circuitry. Detection levels (e.g. oscillation amplitude) can thus be adjusted by means of a DC level, of the threshold value signal.

According to some example embodiments, the peak value detector circuit includes a first peak value detector for detecting a maximum of the (high-pass-) filtered supply signal and a second peak value detector for detecting a minimum of the (high-pass-) filtered supply signal. The comparator circuit includes a first comparator for comparing the detected maximum (peak value) with an upper threshold value and a second comparator for comparing the detected minimum (peak value) with a lower threshold value. However, fast comparators are not required for this purpose.

According to some example embodiments, the reference voltage source is designed to provide a first threshold value signal corresponding to the upper threshold value for the first comparator and a second threshold value signal corresponding to the lower threshold value for the second comparator. This can be achieved, for example, by corresponding voltage dividers.

According to some example embodiments, the comparator circuit is designed to indicate an amplitude fluctuation of the regulated supply signal if the detected maximum exceeds the upper threshold value and the detected minimum understeps the lower threshold value. The circuit can thus be made robust in terms of undershooting or overshooting due to load changes.

According to some example embodiments, the detection circuit is designed as an integrated detection circuit. The integrated detection circuit can be integrated together with a radar or lidar (light detection and ranging) circuit on a common semiconductor chip, and the regulated supply signal can be a regulated supply voltage for the radar or lidar transceiver circuit. In one embodiment, the IC can detect oscillations on all supply domains in the frequency range from, for example, 10 kHz to 25 MHz which exceed the respective nominal voltage ranges by, for example, +/−20%. For highly safety-relevant applications, such as, for example, radar or lidar applications in connection with autonomous driving, this can result in the detection of errors and therefore in more safety.

According to a further aspect of the present disclosure, an integrated circuit is therefore also proposed, including an integrated radar or lidar circuit, an integrated voltage regulator circuit for providing a regulated supply voltage for the radar or lidar transceiver circuit, and an integrated detection circuit for detecting oscillations of the regulated supply voltage according to one of the preceding example embodiments.

According to another further aspect of the present disclosure, a method is proposed for detecting oscillations of a regulated supply signal, including filtering the regulated supply signal in order to obtain a filtered supply signal, detecting an extreme value of the filtered supply signal by means of a peak value detector circuit, comparing the detected extreme value with a threshold value, and indicating an understepping or exceeding of the threshold value.

With example embodiments of the proposed detection circuit, a high bandwidth of the oscillations can be detected (e.g. 10 kHz to 100 MHz). No fast comparators are required (the maximum frequency is defined by the bandwidth of the peak value detector). The detection levels (oscillation amplitude) can easily be adjusted by means of the DC level of the limit values. The relaxation time of the peak value detector (which defines the minimum oscillation frequency) can easily be adjusted by means of the discharge time constant of the peak value detector. The detection circuit can further be designed as insensitive to undershooting or overshooting due to the load changes.

BRIEF DESCRIPTION OF THE DRAWINGS

Some examples of devices and methods are explained in detail below purely by way of example with reference to the attached figures. In the figures:

FIG. 4 shows different interferences of a regulated supply signal and responses of the detection circuit thereto; and FIG. 5 shows a flow diagram of a method for detecting oscillations of a regulated supply signal according to the present disclosure.

DETAILED DESCRIPTION

Some examples will now be described in detail with reference to the attached figures. However, further possible examples are not restricted to the features of these embodiments described in detail. Said further possible examples can have modifications of the features and equivalents and alternatives to the features. The terminology used herein to describe specific examples is furthermore not intended to be limiting for further possible examples.

In the entire description of the figures, identical or similar reference numbers relate to identical or similar elements or features which can be implemented in each case in an identical or modified form while providing an identical or similar function. The sizes of lines, layers and/or areas can further be exaggerated in the figures for illustrative purposes.

If two elements A and B are combined using the term "or", this is to be understood to mean that all possible combinations are disclosed, i.e. A only, B only, and also A and B, unless expressly defined otherwise in the individual case. The terms "at least one of A and B" or "A and/or B" can be used as an alternative wording for the same combinations. The same applies accordingly to combinations of more than two elements.

If a singular form, e.g. "a, one" and "the" is used and the use of only a single element is neither explicitly nor implicitly defined as obligatory, further examples can also use a plurality of elements in order to implement the same function. If a function is described below as being implemented using a plurality of elements, further examples can implement the same function using a single element or a single processing entity. It furthermore goes without saying that the terms "comprises", "comprising", "has" and/or "having" are used to describe the presence of the indicated features, integers, steps, operations, processes, elements, components and/or a group thereof, but do not exclude the presence or the addition of one or more of the features, integers, steps, operations, processes, elements, components and/or a group thereof.

Figure 1A:
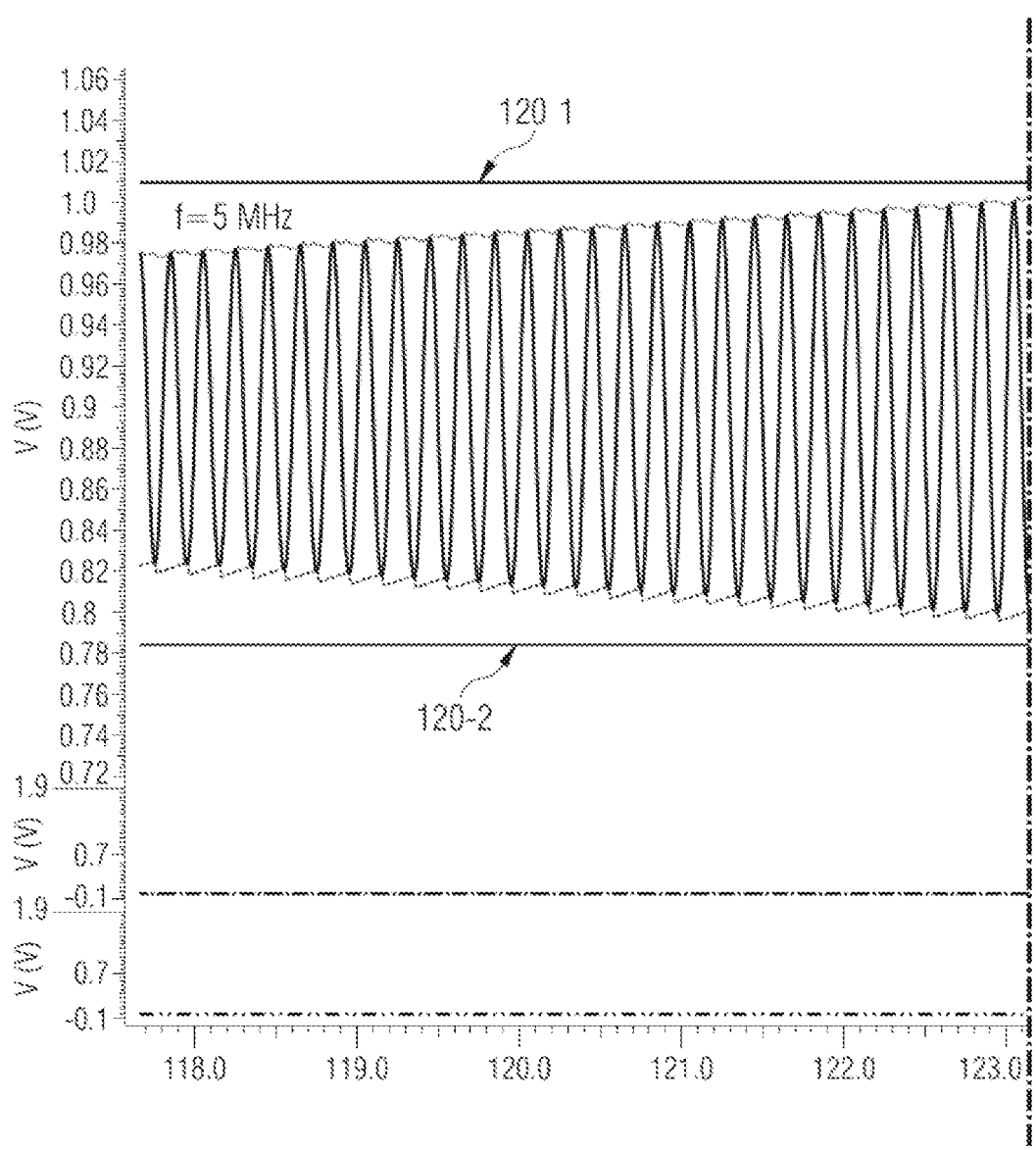
FIGS. 1A and 1B show an active principle of a detection circuit for detecting oscillations of a regulated supply signal according to the present disclosure.
Figure 1B:
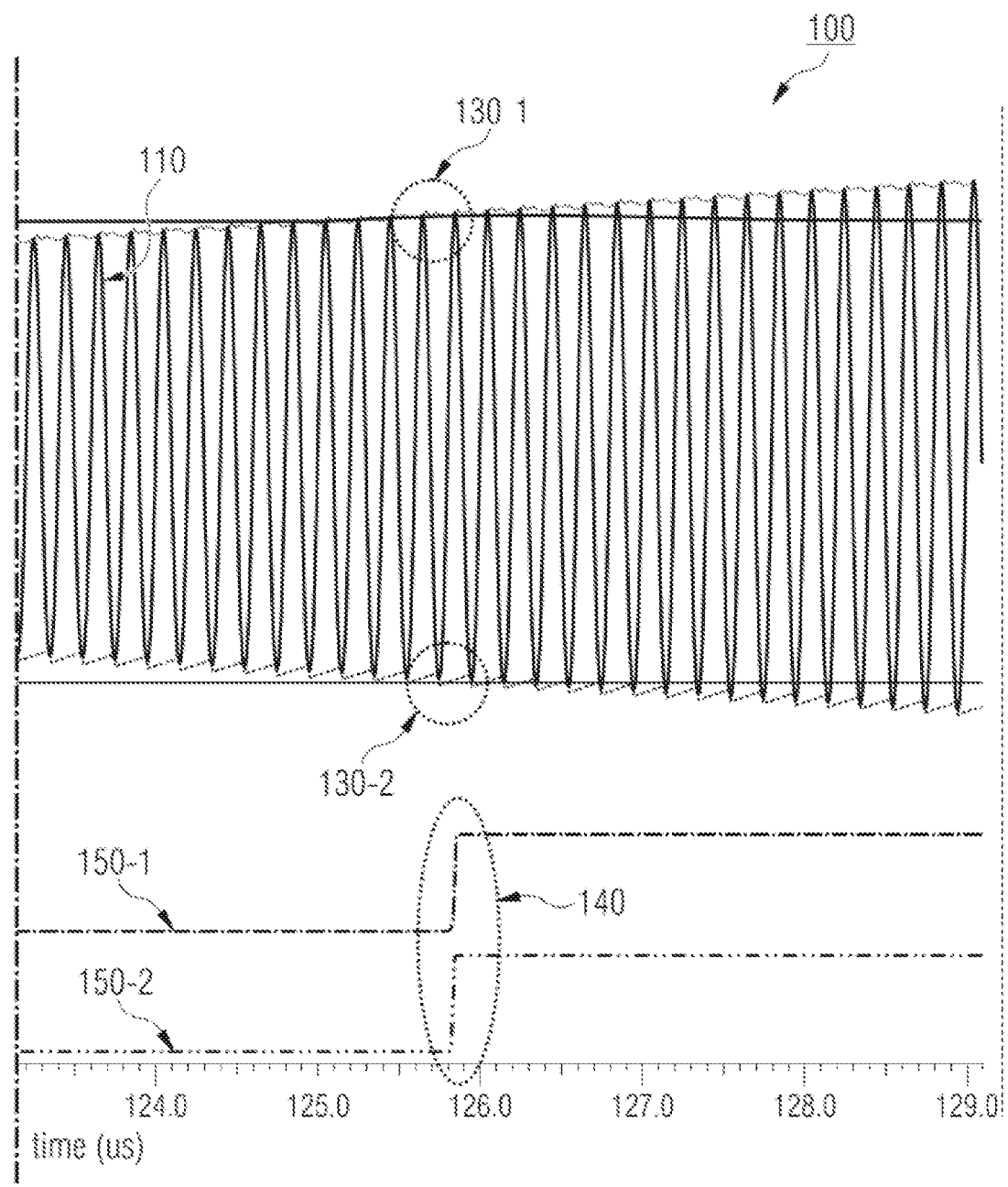

FIGS. 1A and 1B show the active principle of a detection circuit for detecting oscillations of a regulated supply signal according to the present disclosure. The waveforms shown in FIGS. 1A and 1B are conjoined at their respective dotted boundaries to form continuous waveforms across the figures.

Reference number 110 denotes an oscillating supply signal. The supply signal 110 may, for example, be a regulated DC voltage signal with oscillations due to voltage regulator instabilities. The regulated DC voltage signal fluctuates in an unwanted manner, such as, for example, due to a defect (e.g. broken bonding wire), around a DC mean value. FIG. 1 shows, purely by way of example, an oscillation at a frequency of 5 MHz. An amplitude of the (unwanted) oscillation increases over time. The supply signal may, for example, be a voltage supply signal for a semiconductor chip.

It may then be desirable to detect such unwanted oscillations of regulated supply signals as from a specific oscillation amplitude and then, if necessary, take measures, such as, for example, an error message or a shutdown. FIGS. 1A and 1B shows an upper limit value 120-1 and a lower limit value 120-2. The two limit values 120-1 and 120-2 can be disposed, for example, symmetrically around a mean value of the oscillating supply signal 110. Due to the emergence of the unwanted oscillation of the supply signal 110, the signal amplitude of the latter eventually reaches a level such that the oscillating supply signal 110 understeps or exceeds both the upper and the lower limit value 120-1 and 120-2. Reference number 130-1 indicates that the upper limit value 120-1 has been exceeded. Similarly, the understepping of the lower limit value 120-2 is indicated by reference number 130-2. Due to the relatively high oscillation frequency of, here, by way of example, 5 MHz, the exceedance 130-1 and the understepping 130-2 take place more or less simultaneously. The time at which the limit values 130-1 and 130-2 are exceeded or understepped is indicated in FIG. 1 by reference number 140. At the time 140, two detection signals 50-1 and 150-2 jump from "low" to "high". The detection signal 150-1 is assigned to the exceedance of the upper limit value 120-1, the detection signal 105-2 is assigned to the understepping of the lower limit value 120-2, and, as long as the oscillating supply signal 110 moves within the two limit values 120-1 and 120-2, both detection signals 150-1 and 150-2 are in each case "low". If the oscillating supply signal 110 leaves the range within the limit values 120-1 and 120-2, the detection signals 150-1 and 105-2 in each case jump to "high".

The supply voltage 110 to be monitored can, for example, be high-pass-filtered. Two peak value detectors, for example, can track the upper and lower peaks of the filtered supply voltage at the output of a high-pass filter. The peak levels can be compared with an upper and a lower limit value 120-1, 120-2. If the peak levels exceed both the upper and the lower limit value 120-1, 120-2, a supply oscillation can be detected.

Figure 2:
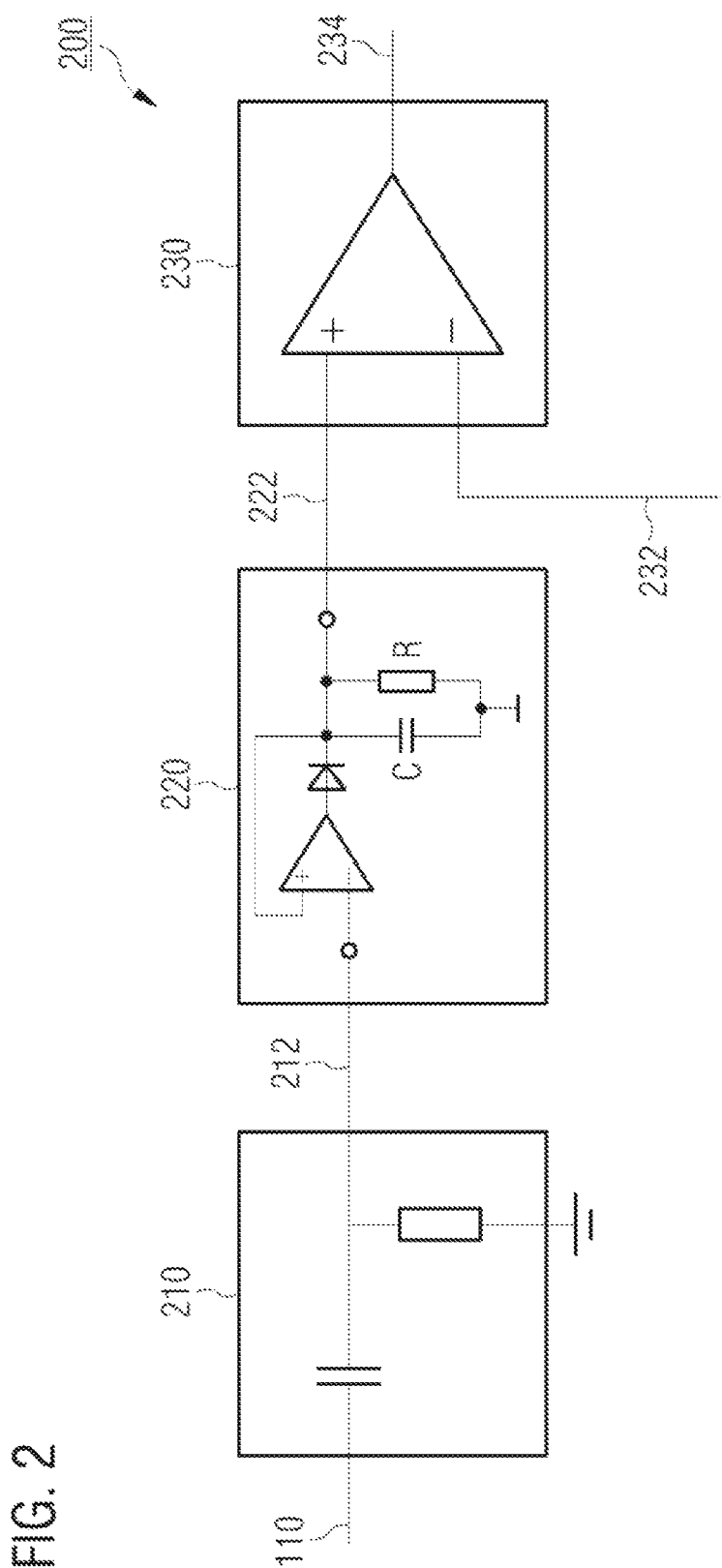
FIG. 2 shows a block diagram of a detection circuit for detecting oscillations of a regulated supply signal according to the present disclosure.

A schematic block diagram of a detection circuit 200 with which oscillation amplitudes of a regulated supply signal above specific limit values can be detected, is shown schematically in FIG. 2.

The detection circuit 200 comprises a filter circuit 210 to filter the regulated (and unwantedly oscillating) supply signal 110 in order to obtain a filtered supply signal 212. The filter signal 210 may, for example, be a bandpass filter circuit or a high-pass filter circuit. The detection circuit 200 further comprises a peak value detector circuit 220 which is designed to detect an extreme value (minimum and/or maximum) of the filtered supply signal 212. The detection circuit 200 further comprises a comparator circuit 230 which is designed to compare the detected extreme value 222 with a predefined limit value or threshold value 232 and to indicate an exceeding or understepping of the threshold value at its output 234.

Figure 3A:
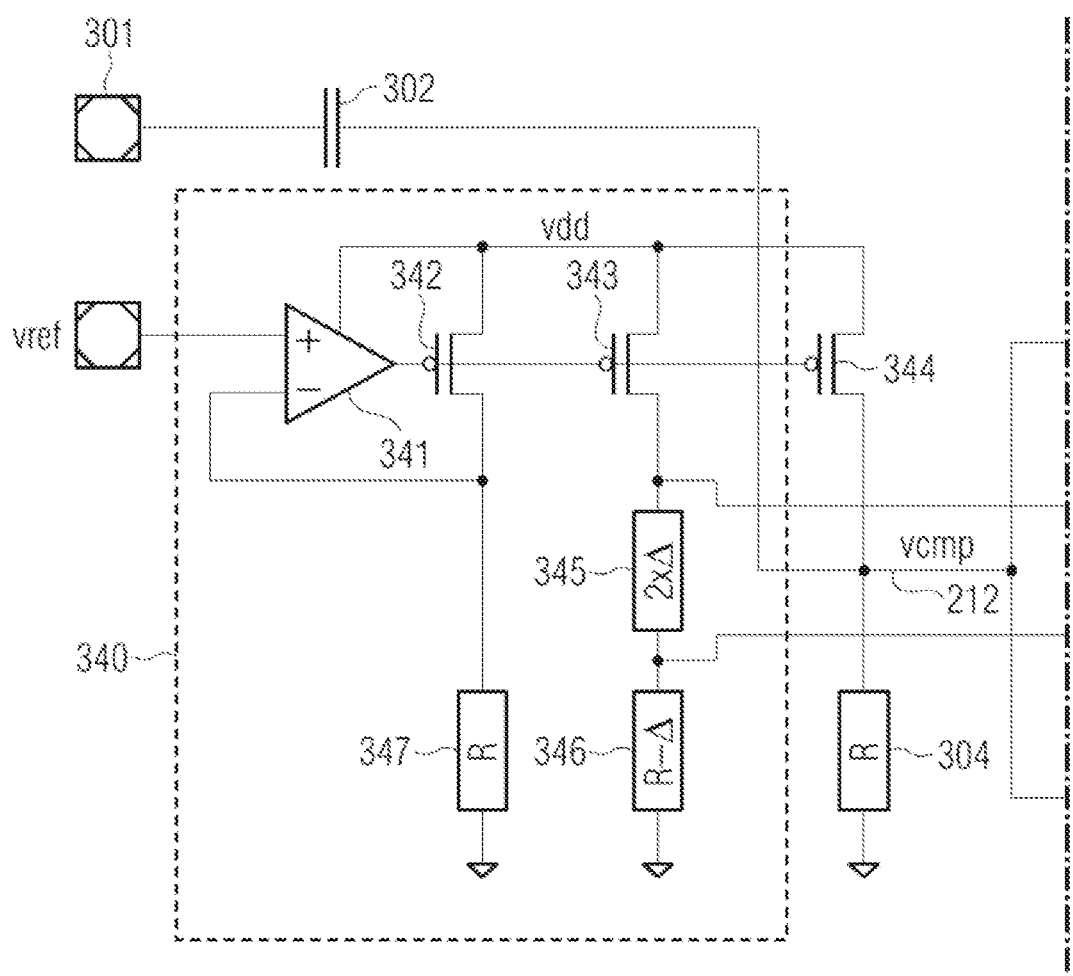
FIGS. 3A and 3B show a schematic block diagram of a detection circuit according to one example embodiment.
Figure 3B:
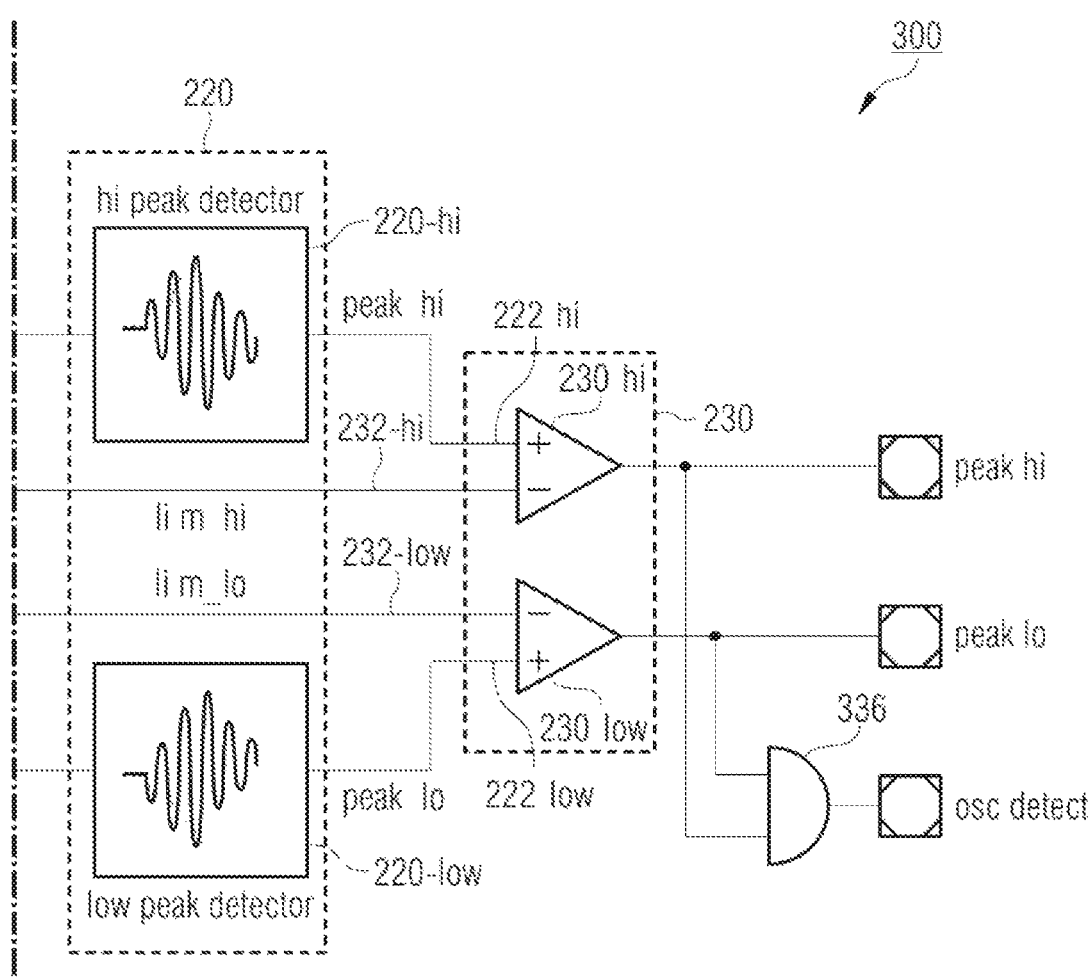

The block diagram shown in FIG. 2 presents only a schematic view in order to illustrate the underlying principles of the present disclosure. The individual blocks 210, 220, 230 can be implemented in numerous different ways by means of circuitry. One possible implementation is explained in detail below with reference to FIGS. 3A and 3B. FIGS. 3A and 3B are conjoined at their respective dotted boundaries to form a single schematic block diagram.

The detection circuit 300 shown in FIGS. 3A and 3B for detecting oscillations of a regulated supply signal comprises an input 301 for the regulated supply signal 110. On the input side, the detection circuit 300 comprises a high-pass filter circuit which comprises a capacitor 302 and a resistor 304. On the output side, a peak value detection circuit 220 is connected to the high-pass filter circuit. The peak value detector circuit 220 comprises a first peak value detector 220-hi and a second peak value detector 220-low. On the output side, the peak value detector circuit 220 is connected to a comparator circuit 230. The comparator circuit 230 comprises a first comparator 230-hi connected to the output of the first peak value detector 220-hi, and a second comparator 230-low connected to the output of the second peak value detector 220-low. Limit value exceedances of the oscillating supply signal 110 can be indicated with corresponding detection signals at the outputs of the comparators 230-hi and 230-low. The outputs of the comparators 230-hi and 230-low are logically linked via an AND gate 336. An oscillation of the regulated supply signal can be indicated at the output of the AND gate 336.

An input connection 301 of the detection circuit 300 can be connected, for example, to a voltage regulator which normally provides a regulated DC voltage. Under certain circumstances, this can result in the occurrence of unwanted oscillations of the regulated DC voltage. These oscillations or exceedances of oscillation amplitudes in relation to specific limit values can be identified with the detection circuit 300. In order to filter out DC components of the oscillating supply signal 110, the input 301 of the detection circuit 300 is connected in the example embodiment shown in FIGS. 3A and 3B to a high-pass filter comprising the capacitor 302 and the resistor 304. A bandpass filter circuit could also be provided as an alternative to the high-pass filter circuit.

The input connection 301 of the detection circuit 300 is connected to a first electrode of the capacitor 302. A second electrode of the capacitor 302 is connected to a first connection of the resistor 304. A second connection of the resistor 304 is connected to ground. The high-pass-filtered supply signal 212 can be tapped at a node "vcmp" between the capacitor 302 and the resistor 304. The node "vcmp" is connected to both an input of the first peak value detector 220-hi and an input of the second peak value detector to 220-low. The first peak value detector to 220-hi serves to detect upper peak values of the oscillating supply signal, while the second peak value detector 220-low serves to detect lower peak values of the oscillating supply signal. The detected upper peak value 222-hi is fed to a first input of the first comparator 230-hi. A first (upper) threshold value signal 232-hi which is provided by means of a reference signal source 340 is fed to the second input of the first comparator 230-hi. The detected lower peak value 222-low is fed to a first input of the second comparator 230-low. A second (lower) threshold value signal 232-low which is similarly provided by means of the reference signal source 340 is fed to the second input of the second comparator 230-low.

The reference signal source 340 comprises a differential amplifier 341 and transistors 342, 343, 344 connected in parallel at its output between a supply potential vdd and ground. An output voltage vref of the differential amplifier 341 is stabilized at a point where the characteristics of the transistors 342, 343, 344 intersect. The gate connections of the transistors 342, 343, 344 are connected in each case to the output of the operational amplifier 341. A resistor 347 is connected between the drain connection of the transistor 342 and ground. Two resistors 345, 346 are connected in series between the drain connection of the transistor 343 and ground. The first threshold value signal 232-hi can be tapped between the drain connection of the transistor 343 and the resistor 345. The second threshold value signal 232-low can be tapped between the two resistors 345 and 346.

In example embodiments, individual circuit blocks can also be implemented in ways other than those shown.

The supply signal monitored by the detection circuit 300 is therefore high-pass-filtered (vcmp). A DC voltage level of the filtered signal vcmp lies between the two limit values 232-hi, 232-low (lim_hi and lim_lo). Two peak value detectors 220-hi, 220-low are connected to the filtered supply signal vcmp. The output signals 222-hi, 222-low of the peak value detectors (peak_hi, peak_lo) are compared with the upper and lower limit value 232-hi, 232-low (lim_hi, lim_lo) which can have a DC voltage difference compared with the DC voltage level of the high-pass-filtered supply signal which is adjustable via the resistors 345, 346, 347. With a corresponding oscillation at the supply input 301, both output signals 222-hi, 222-low of the peak value detectors 220-hi, 220-low exceed their limits. This can be indicated by the output osc_detect of the AND gate 336.

The DC level difference compared with lim_hi/lo to vcmp can be adjustable. Slow high or low peaks (e.g. caused by load change on the regulator) can be detected as "peak_hi"/ "peak_lo", but not as an oscillation. An upper frequency limit of the detection is provided by the bandwidth of the peak value detectors 220-hi, 220-low which can be designed as very high (e.g. ~100 MHz or even higher). A lower frequency limit can be defined by the discharge time of the peak value detectors 220-hi, 220-low. With additional logic (e.g. digital counters), even lower frequencies can be detected if long discharge times are not desired/possible. These relationships are shown graphically in FIG. 4.

The detection circuit 200, 300 can be designed, for example, as an integrated circuit and can be integrated together with an integrated radar or lidar circuit on a common semiconductor chip. The regulated supply signal 110 can be a regulated supply voltage for the integrated radar or lidar circuit and can be provided by an integrated voltage regulator.

To summarize, FIG. 5 also shows a flow diagram of a method 500 for detecting oscillations of a regulated supply signal.

The method 500 comprises filtering 510 the regulated supply signal in order to obtain a filtered supply signal, detecting 520 an extreme value of the filtered supply signal by means of a peak value detector circuit, comparing 530 the detected extreme value with a threshold value, and indicating 540 an understepping or exceedance of the threshold value.

The aspects and features which are described in connection with one specific example of the preceding examples can also be combined with one or more of the further examples in order to replace an identical or similar feature of this further example or additionally to introduce the feature into the further example.

Examples can furthermore be or relate to a (computer) program with a program code to carry out one or more of the above methods if the program is executed on a computer, a processor or a different programmable hardware component. Steps, operations or processes of various of the methods described above can therefore also be performed by programmed computers, processes or other programmable hardware components. Examples can also cover program memory devices, e.g. digital data storage media, which are machine-readable, processor-readable or computer-readable, and which code or contain machine-executable, processor-executable or computer-executable programs and instructions. The program memory devices can be or comprise e.g. digital memories, magnetic storage media, such as, for example, magnetic disks and magnetic tapes, hard drives or optically readable digital data storage media. Further examples can also cover (field) programmable logic arrays ((F)PLAs), (field) programmable gate arrays ((F)PGAs), graphics processor units (GPUs), application-specific integrated circuits (ASICs), integrated circuits (ICs) or a system-on-a-chip (SoC) which are programmed to carry out the steps of the methods described above.

It furthermore goes without saying that the disclosure of a plurality of steps, processes, operations or functions disclosed in the description or the claims is not intended to be understood to mean that they invariably take place in the described sequence, unless this is explicitly indicated in individual cases or is absolutely essential for technical reasons. The performance of a plurality of steps or functions is not therefore limited by the preceding description to a specific sequence. Moreover, in further examples, a single step, a single function, a single process or a single operation can include and/or can be subdivided into a plurality of substeps, subfunctions, subprocesses or suboperations.

If some aspects in the preceding sections have been described in connection with a device or a system, these aspects are also to be understood as a description of the corresponding method. Thus, for example, a block, device or functional aspect of the device or of the system can correspond to a feature, such as a method step, of the corresponding method. Correspondingly, aspects which are described in connection with a method are also to be understood as a description of a corresponding block, a corresponding element, a characteristic or a functional feature of a corresponding device or of a corresponding system.

The following claims are incorporated herewith into the detailed description, wherein each claim can stand alone as a separate example. It should also be noted that—although a dependent claim relates in the claims to a specific combination with one or more other claims—other examples can also comprise a combination of the dependent claim with the subject-matter of every other dependent or independent claim. Such combinations are herewith explicitly proposed, unless it is indicated in individual cases that a specific combination is not intended. Furthermore, features of a claim are intended to be included in each other independent claim, even if this claim is not directly defined as dependent on this other independent claim.

What is claimed is:

1. A detection circuit for detecting oscillations of a regulated supply signal, the detection circuit comprising:
   a filter circuit configured to filter the regulated supply signal in order to obtain a filtered supply signal;
   a peak value detector circuit configured to detect an extreme value of the filtered supply signal; and
   a comparator circuit configured to compare the detected extreme value with a threshold value and to indicate at least one of an understepping or exceedance of the threshold value.

2. The detection circuit as claimed in claim 1, wherein the filter circuit comprises a high-pass filter or a bandpass filter.

3. The detection circuit as claimed in claim 1, further comprising:
   a reference signal source configured to adjust at least one threshold value signal according to the threshold value for the comparator circuit.

4. The detection circuit as claimed in claim 3, wherein the reference signal source comprises a bandgap reference circuit.

5. The detection circuit as claimed in claim 1, wherein:
   the peak value detector circuit comprises a first peak value detector configured to detect a maximum of the filtered supply signal, and a second peak value detector configured to detect a minimum of the filtered supply signal, and wherein:
   the comparator circuit comprises a first comparator configured to compare the detected maximum with an upper threshold value, and a second comparator configured to compare the detected minimum with a lower threshold value.

6. The detection circuit as claimed in claim 5, wherein a reference voltage source is configured to provide a first threshold value signal corresponding to the upper threshold value for the first comparator, and provide a second threshold value signal corresponding to the lower threshold value for the second comparator.

7. The detection circuit as claimed in claim 5, wherein the comparator circuit is configured to indicate an amplitude fluctuation of the regulated supply signal if the detected maximum exceeds the upper threshold value and the detected minimum understeps the lower threshold value.

8. The detection circuit as claimed in claim 7, wherein a bandwidth of the first peak value detector and a bandwidth of the second peak value detector are greater than twice an upper limit frequency for detecting the amplitude fluctuation.

9. The detection circuit as claimed in claim 1, wherein the detection circuit is configured as an integrated detection circuit.

10. The detection circuit as claimed in claim 9, wherein the integrated detection circuit is integrated together with a radar circuit or a lidar circuit on a common semiconductor chip, and the regulated supply signal is a regulated supply voltage for the radar circuit or the lidar circuit.

11. An integrated circuit, comprising:
an integrated radar circuit or an integrated lidar circuit;
an integrated voltage regulator circuit configured to provide a regulated supply voltage for the integrated radar circuit or the integrated lidar circuit; and
an integrated detection circuit configured to detect oscillations of the regulated supply voltage, the integrated detection circuit comprising:
a filter circuit configured to filter a regulated supply signal corresponding to the regulated supply voltage in order to obtain a filtered supply signal;
a peak value detector circuit configured to detect an extreme value of the filtered supply signal; and
a comparator circuit configured to compare the detected extreme value with a threshold value and to indicate at least one of an understepping or exceedance of the threshold value.

12. A method for detecting oscillations of a regulated supply signal, the method comprising:
filtering the regulated supply signal in order to obtain a filtered supply signal;
detecting at least one extreme value of the filtered supply signal by means of a peak value detector circuit;
comparing the at least one extreme value with a corresponding threshold value; and
indicating at least one of an exceedance or understepping of the corresponding threshold value by the at least one extreme value.

13. The method as claimed in claim 12, wherein filtering the regulated supply signal in order to obtain the filtered supply signal comprises a high-pass or a bandpass filtering.

14. The method as claimed in claim 12, wherein the at least one extreme value includes a maximum of the filtered supply signal that is detected with a first peak value detector and a minimum of the filtered supply signal is detected with a second peak value detector, and wherein comparing the at least one extreme value with the corresponding threshold value includes comparing the maximum of the filtered supply signal with an upper threshold value and comparing the minimum of the fitered supply signal with a lower threshold value.

15. The method as claimed in claim 14, wherein indicating the exceedance or understepping of the corresponding threshold value by the at least one extreme value includes:
indicating an amplitude fluctuation of the regulated supply signal if the maximum of the filtered supply signal exceeds the upper threshold value and the minimum of the filtered supply signal understeps the lower threshold value.

\* \* \* \* \*